United States Patent
Nakano

(10) Patent No.: US 7,246,017 B2
(45) Date of Patent: Jul. 17, 2007

(54) WAVEFORM MEASURING APPARATUS FOR MEASURING WAVEFORM DATA AND WRITING MEASUREMENT DATA TO ACQUISITION MEMORY

(75) Inventor: Shin'ichi Nakano, Musashino (JP)

(73) Assignee: Yokogawa Electric Corporation, Tokyo (JP)

( * ) Notice: Subject to any disclaimer, the term of this patent is extended or adjusted under 35 U.S.C. 154(b) by 0 days.

(21) Appl. No.: 11/104,417

(22) Filed: Apr. 13, 2005

(65) Prior Publication Data
US 2005/0234665 A1 Oct. 20, 2005

(30) Foreign Application Priority Data
Apr. 16, 2004 (JP) .............................. 2004-121216

(51) Int. Cl.
*G01R 13/00* (2006.01)
(52) U.S. Cl. .............................. 702/66; 702/67; 702/70; 702/80; 324/76.15
(58) Field of Classification Search ................ 702/66, 702/67, 70, 71, 79, 80, 189, 124–126
See application file for complete search history.

(56) References Cited

U.S. PATENT DOCUMENTS

| | | | |
|---|---|---|---|
| 5,929,838 A * | 7/1999 | Hall ........................ 345/440.1 |
| 6,271,773 B1 * | 8/2001 | Kobayashi ................... 341/51 |
| 6,279,130 B1 * | 8/2001 | Moser ........................ 714/724 |
| 6,459,256 B1 * | 10/2002 | Pickerd .................. 324/121 R |
| 6,892,150 B2 * | 5/2005 | Pickerd et al. ................ 702/67 |
| 6,909,979 B2 * | 6/2005 | Saitou et al. ................. 702/66 |
| 2002/0147554 A1 * | 10/2002 | Pickerd ....................... 702/66 |
| 2006/0020407 A1 * | 1/2006 | Montijo et al. .............. 702/67 |

FOREIGN PATENT DOCUMENTS

JP 5-119069 5/1993

* cited by examiner

*Primary Examiner*—Hal Wachsman
(74) *Attorney, Agent, or Firm*—Westerman, Hattori, Daniels & Adrian, LLP.

(57) ABSTRACT

A waveform measuring apparatus can sequentially and continuously read measurement data from an acquisition memory, where the measurement data has been written by multiple acquisitions, after acquisition stops. The waveform measuring apparatus writes measurement data to the acquisition memory based on a trigger signal, and includes a pseudo trigger signal generation unit that continuously reads measurement data that is written in the acquisition memory.

5 Claims, 2 Drawing Sheets

WAVEFORM MEASURING APPARATUS FOR MEASURING WAVEFORM DATA AND WRITING MEASUREMENT DATA TO ACQUISITION MEMORY

Priority is claimed on Japanese Patent Application No. 2004-121216, filed Apr. 16, 2004, the content of which is incorporated herein by reference.

BACKGROUND OF THE INVENTION

1. Field of the Invention

This invention relates to a waveform measuring apparatus that writes measurement data to a memory for waveform data acquisition (hereinafter "acquisition memory") based on a trigger signal. In a waveform measurement instrument that can write multiple acquisition results by dividing the acquisition memory, such as a digital oscilloscope, this invention provides devices for sequentially referring to measurement data in multiple acquisition memories after the acquisition stops.

2. Description of the Related Art

Related art regarding a waveform measuring apparatus that writes measurement data to an acquisition memory based on a trigger signal is disclosed in publications such as Japanese Unexamined Patent Application, First publication No. 5-119069.

FIG. 2 is a function block diagram of a general configuration of a conventional waveform measuring apparatus. Reference numeral 1 represents a processor that controls the overall apparatus. Reference numeral 2 represents a display unit that creates and displays display data, based on measurement data read from an acquisition memory.

Reference numeral 3 represents a trigger signal generation unit that generates a trigger signal by using an analog signal Ei, that is input to the apparatus, and preset conditions. Reference numeral 4 is an AD conversion unit that adjusts the analog signal Ei input to the apparatus to an appropriate level, samples it, digitizes it, and creates measurement data to be written in the acquisition memory.

Reference numeral 5 represents an acquisition control unit that is controlled by a control signal from the processor 1. Reference numeral 6 represents an acquisition memory having addresses of (n1+n2) bits and a data width of n3 bits. The acquisition memory 6 reads/writes measurement data based on the trigger signal.

In accordance with the control signal from the processor 1, the acquisition control unit 5 executes processing to write measurement data from the AD conversion unit 4 to the acquisition memory 6, and to pass measurement data that is read to the display unit 2.

An upper bit counter 7 and a lower bit counter 8 manage addresses for reading and writing to/from the acquisition memory 6, and are controlled by the acquisition control unit 5.

The upper bit counter 7 specifies the upper n1 bits of an address in the acquisition memory 6; an initial value of the upper bit counter 7 is set by the processor 1 via the acquisition control unit 5, and is incremented by 1 each time the trigger signal is generated.

The lower bit counter 8 specifies the lower n2 bits of an address in the acquisition memory 6; a clock signal is applied to the lower bit counter 8 from the processor 1 via the acquisition control unit 5, shifting the specified address.

When acquiring and writing measurement data, the processor 1 presets an initial value in the upper bit counter 7 via the acquisition control unit 5, and acquisition starts when a trigger signal is input. After acquisition starts, the acquisition control unit 5 supplies a clock to the lower bit counter 8, and the lower bit counter 8 sequentially generates addresses for storing the measurement data in the acquisition memory 6.

The output of the upper bit counter 7 is constant until the trigger signal generation unit 3 outputs the next trigger signal, so that the measurement data is stored within a range where the upper n1 bits of the address in the acquisition memory 6 are determined by the output of the upper bit counter 7.

When the trigger signal generation unit 3 outputs the next trigger signal, the acquisition control unit 5 adds 1 to the set value of the upper bit counter 7, thereby shifting the storage range in the acquisition memory 6 to another area.

If address management in the acquisition memory 6 is executed so that (n1+n2)=10, n1=3, and n2=7, the total number of addresses is 1024; these can be divided into areas of eight groups, each containing 128 addresses, by controlling the upper three bits.

To read and display the measurement data, the upper n1 bits of an address that corresponds to an area being read in the upper bit counter 7 are set by the processor 1 via the acquisition control unit 5, a clock signal of n2 bits is applied to the lower bit counter 8 via the acquisition control unit 5, and the measurement data in that area is read and passed to the display unit 2.

When the set value of the upper bit counter 7 is incremented, the measurement data displayed by the display unit 2 is initialized and new data is displayed. Data can also be overwritten by changing the setting of the display unit 2.

In conventional waveform measuring apparatuses, to read and display measurement data that is obtained by multiple acquisitions and written and stored in multiple areas of an acquisition memory, after acquisition stops, the user must either specify an area for display, then read and display data of one acquisition at a time, or overlap all the data and display them simultaneously.

This makes it impossible to reproduce waveforms that change at high speed with each acquisition, such as switching waveforms that change when a switching regulator circuit activates.

SUMMARY OF THE INVENTION

Accordingly, it is an object of this invention to realize a waveform measuring apparatus that can sequentially and continuously read measurement data from an acquisition memory, where the measurement data has been written in multiple acquisitions, after acquisition stops.

In order to achieve the above objects, the present invention is configured as follows.

In the first aspect of the present invention, a waveform measuring apparatus that writes measurement data to an acquisition memory based on a trigger signal, comprises a pseudo trigger signal generation unit that continuously reads measurement data that is written in the acquisition memory.

In the second aspect of the present invention, the waveform measuring apparatus according to the first aspect, further comprises a switch unit that switches the trigger signal and the pseudo trigger signal.

In the third aspect of the present invention, the waveform measuring apparatus according to the first and second aspects, further comprises a write prohibit unit that prevents overwriting to the acquisition memory while measurement data is being read from the acquisition memory in accordance with the pseudo trigger signal.

In the fourth aspect of the present invention, in the waveform measuring apparatus according to one of the first to the third aspects, addresses in the acquisition memory are managed by an upper bit counter and a lower bit counter; a set value of the upper bit counter is incremented and a clock signal is supplied to the lower bit counter each time the trigger signal or the pseudo trigger signal is input.

In the fifth aspect of the present invention, in the waveform measuring apparatus according to one of the first to the fourth, the pseudo trigger signal is created by a processor.

BRIEF DESCRIPTION OF THE DRAWINGS

FIG. 1 is a function block diagram of an embodiment of a waveform measuring apparatus that the present invention is applied in.

DETAILED DESCRIPTION

Figure 1:
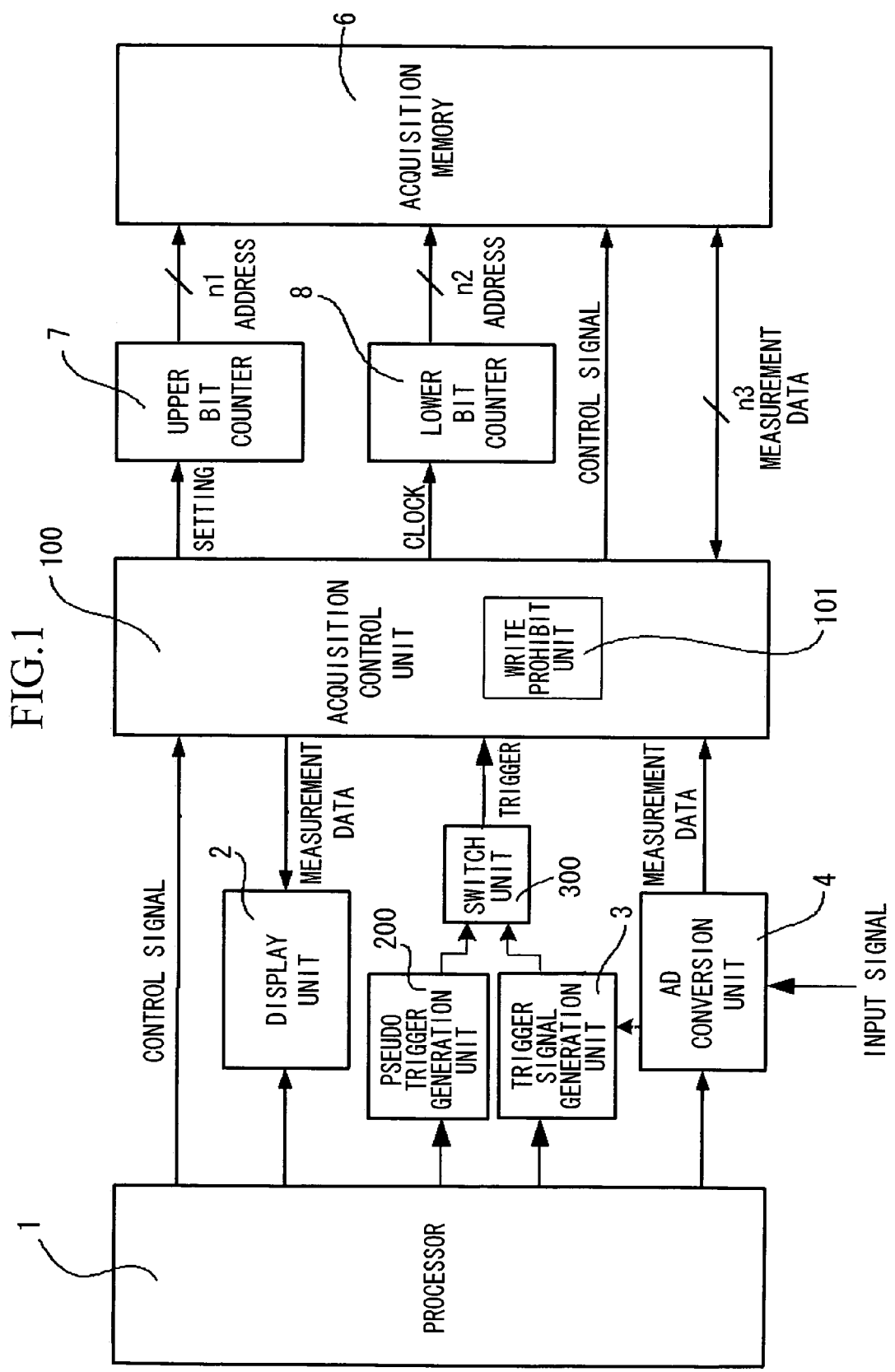
Figure 2:
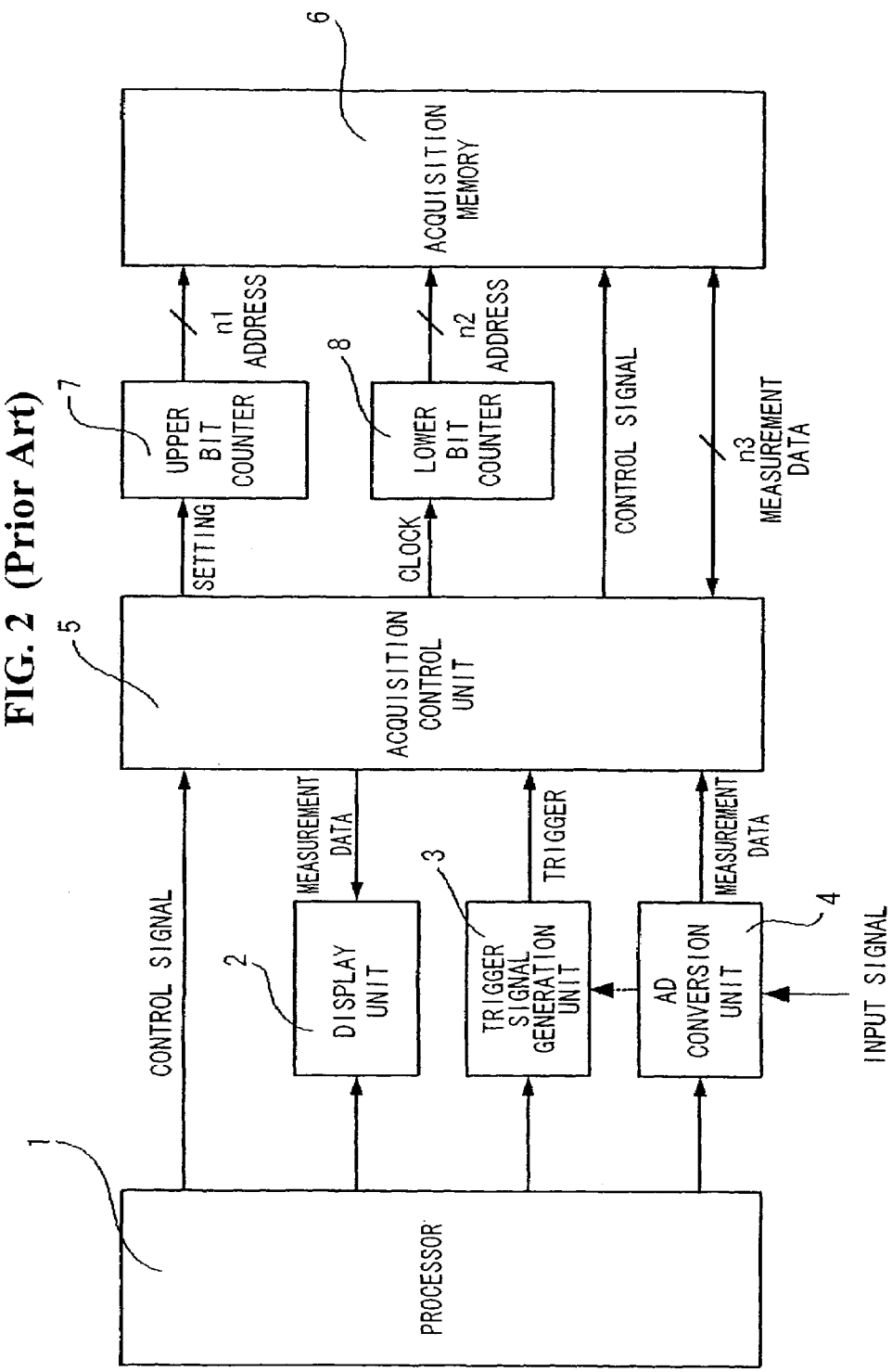
FIG. 2 is a function block diagram of a general configuration of a conventional, prior art waveform measuring apparatus.

The present invention will be explained in detail using the drawings. FIG. 1 is a function block diagram of an embodiment of a waveform measuring apparatus that the invention is applied in. Parts that are the same as those of the conventional apparatus described in FIG. 2 are represented by the same reference numerals and are not explained further. The explanation below focuses on parts that are characteristic of this invention.

In FIG. 1, reference numeral 100 represents an acquisition control unit 100. In addition to having the same functions as the conventional acquisition control unit 5, the acquisition control unit 100 includes a write prohibit unit 101.

The write prohibit unit 101 prevents overwriting of acquired measurement data by masking write control signals to the acquisition memory 6 while a pseudo trigger signal is being input.

Reference numeral 200 represents a pseudo trigger generation unit 200 that creates a fixed-cycle pseudo trigger signal based on a setting made by the processor 1. Reference numeral 300 represents a switch unit that selectively connects the output from the trigger signal generation unit 3 or the output from the pseudo trigger generation unit 200 to the acquisition control unit 100, in compliance with a manual operation that is performed as necessary.

In an acquisition mode for writing measurement data to the acquisition memory, the switch unit 300 operates in the same manner as a conventional apparatus by connecting the output of the trigger signal generation unit 3 to the acquisition control unit 100. While acquisition is stopped, the switch unit 300 operates in the same manner as a conventional apparatus if the output of the trigger signal generation unit 3 is connected to the acquisition control unit 100.

When an acquisition is executed while the switch unit 300 is connecting the output of the pseudo trigger generation unit 200 to the acquisition control unit 100, the write prohibit unit 101 prevents the acquisition control unit 100 from sending write control signals to the acquisition memory 6 as mentioned above, protecting acquired measurement data from being overwritten.

Therefore, measurement data that is stored in areas of the acquisition memory 6 is sequentially read in synchronism with the pseudo trigger signal as though it were acquired data, making it possible to continuously reproduce the waveforms of different measurement data in each acquisition.

While the pseudo trigger signal is generated by the pseudo trigger generation unit 200 in the embodiment described above, it can be created by the processor 1 instead.

It is claimed:

1. A waveform measuring apparatus that acquires waveform data, measures said waveform data to create measurement data and writes said measurement data to an acquisition memory, comprising:

a trigger signal generation unit that generates a trigger signal to trigger writing a operation of said measurement data to said acquisition memory: and a pseudo trigger signal generation unit that generates a pseudo trigger signal in a set cycle to continously read said measurement data written in said acquisition memory at a plurality of areas which are divided and grouped by upper bits of an address in said acquisition memory.

2. The waveform measuring apparatus according to claim 1, further comprising a switch unit that switches the trigger signal and the pseudo trigger signal.

3. The waveform measuring apparatus according to claim 1, further comprising a write prohibit unit that prevents overwriting to the acquisition memory while measurement data is being read from the acquisition memory in accordance with the pseudo trigger signal.

4. The waveform measuring apparatus according to claim 1, wherein addresses in the acquisition memory are managed by an upper bit counter and a lower bit counter, a set value of the upper bit counter being incremented each time the trigger signal or the pseudo trigger signal is input and a clock signal being supplied to the lower bit counter.

5. The waveform measuring apparatus according to claim 1, wherein the pseudo trigger signal is created by a processor.

* * * * *